(12) United States Patent
McCormick

(10) Patent No.: US 9,024,618 B2
(45) Date of Patent: May 5, 2015

(54) SELF-HEATING ELECTROMETER FOR HIGH PRESSURE ION CHAMBER FOR VERIFICATION OF TEMPERATURE COMPENSATION

(75) Inventor: Dan Jay McCormick, Hudson, OH (US)

(73) Assignee: General Electric Company, Schenectady, NY (US)

(*) Notice: Subject to any disclaimer, the term of this patent is extended or adjusted under 35 U.S.C. 154(b) by 443 days.

(21) Appl. No.: 13/433,433

(22) Filed: Mar. 29, 2012

(65) Prior Publication Data

US 2013/0256550 A1    Oct. 3, 2013

(51) Int. Cl.
*G01R 19/00* (2006.01)
*G01R 19/32* (2006.01)

(52) U.S. Cl.
CPC ........ *G01R 19/0061* (2013.01); *G01R 19/0023* (2013.01); *G01R 19/32* (2013.01)

(58) Field of Classification Search
CPC ....... G01N 30/64; G01N 30/96; G01N 27/62; G01R 19/0023; G01R 19/32; G01R 19/0061; G01R 21/14; G01T 1/185

USPC ....................... 324/120, 123 R, 105, 459, 457
See application file for complete search history.

(56) References Cited

U.S. PATENT DOCUMENTS 3,742,217 A  *  6/1973  Eakman et al. ............... 250/308
2004/0221843 A1*  11/2004  Baecke .................... 128/203.16

* cited by examiner

*Primary Examiner* — Tung X Nguyen
*Assistant Examiner* — Son Le
(74) *Attorney, Agent, or Firm* — Cooper Legal Group, LLC

(57) ABSTRACT

An apparatus and method for verifying the temperature compensation correction factor accuracy of an electrometer is provided. The electrometer includes an electrical amplifier to convert a current signal to a voltage signal. The electrometer also includes a compensation circuit to modify the voltage signal for temperature compensation. The electrometer further includes a heat producing device to induce a temperature change of the electrical amplifier and the compensation circuit. An environmental radiation monitor is also provided. The environmental radiation monitor includes a power supply, a high pressure ionization chamber, and the electrometer. The method includes providing an environmental radiation monitor, measuring the voltage signal at a first time, activating a heat producing device, measuring the voltage signal at a second time, and comparing the two measured values of the voltage signal.

14 Claims, 4 Drawing Sheets

SELF-HEATING ELECTROMETER FOR HIGH PRESSURE ION CHAMBER FOR VERIFICATION OF TEMPERATURE COMPENSATION

BACKGROUND OF THE INVENTION

1. Field of the Invention

The invention relates to verification of temperature compensation in electrometers, and specifically relates to verification of temperature compensation in electrometers using heat application.

2. Discussion of Prior Art

Electrometers are used to convert relatively low amperage current signals to voltage signals for processing. In one example, electrometers can be used to convert the low amperage current signals from the output of a high pressure ionization chamber of an environmental radiation monitor. In one example, one or more environmental radiation monitors can be deployed in the field proximate to known radiation sources such as nuclear power generation stations to monitor radiation levels. Of course, environmental radiation monitors can be deployed anywhere that it is desirable to monitor radiation levels. As such, the environmental radiation monitors can be subjected to various environmental conditions. The environmental conditions may include temperature variation.

Temperature change can induce operational drift of some operating components of the electrometer can cause unreliable performance of the monitor. Such, change in operation can be referred to as temperature drift. Correction factors are implemented into the operating components of the electrometer to compensate for the temperature drift. Other factors can negatively affect the correction factor performance of the electrometer. For example, forms of water such as increased humidity or condensation that come into contact with the critical parts of the electrometer can negatively affect the correction factor. In another example, a service technician may have implemented an incorrect correction factor into the electrometer. In yet another example, the correction factor may simply have been "lost" by an electronic controller. Each of these events can cause the radiation readings of the environmental radiation monitor to be unstable at times, or even wrong at all times. As a result, it is difficult for an end user of the environmental radiation monitor to determine whether the correction factors remain accurate over time. Therefore, there is a need for an improved apparatus and method for verifying the temperature compensation correction factor accuracy of an electrometer.

BRIEF DESCRIPTION OF THE INVENTION

The following summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

One aspect of the invention provides an electrometer that included an electrical amplifier receiving a current signal. The electrical amplifier is configured to convert the current signal to a voltage signal. The electrometer also includes a compensation circuit electrically connected to the electrical amplifier. The compensation circuit is configured to modify the voltage signal. The electrometer further includes a heat producing device. The heat producing device is configured to induce a temperature change of the electrical amplifier and the compensation circuit.

Another aspect of the invention provides an environmental radiation monitor that includes a power supply and a high pressure ionization chamber electrically connected to the power supply. The high pressure ionization chamber is configured to produce a current signal. The environmental radiation monitor also includes an electrometer electrically connected with the high pressure ionization chamber. The electrometer includes an electrical amplifier receiving the current signal. The electrical amplifier is configured to convert the current signal to a voltage signal. The electrometer also includes a compensation circuit electrically connected to the electrical amplifier. The compensation circuit is configured to modify the voltage signal. The electrometer also includes a heat producing device. The heat producing device is configured to induce a temperature change of the electrical amplifier and the compensation circuit.

Another aspect of the invention provides a method of conducting a temperature compensation test cycle for an environmental radiation monitor. The method includes providing an environmental radiation monitor. The environmental radiation monitor includes a power supply and a high pressure ionization chamber electrically connected to the power supply. The high pressure ionization chamber is configured to produce a current signal. The environmental radiation monitor also includes an electrometer electrically connected with the high pressure ionization chamber. The electrometer includes an electrical amplifier receiving the current signal The electrical amplifier is configured to convert the current signal to a voltage signal. The electrometer also includes a compensation circuit electrically connected to the electrical amplifier. The compensation circuit is configured to modify the voltage signal. The electrometer also includes a heat producing device. The heat producing device is configured to induce a temperature change of the electrical amplifier and the compensation circuit. The method further includes measuring the voltage signal at a first time. The method also includes activating the heat producing device. The heat producing device induces a temperature change of the electrical amplifier and the compensation circuit. The method further includes measuring the voltage signal at a second time. The method also includes comparing the measured value of the voltage signal at the first time to the value of the voltage signal at the second time. The comparison indicates the accuracy of an electrometer temperature compensation.

BRIEF DESCRIPTION OF THE DRAWINGS

The foregoing and other aspects of the invention will become apparent to those skilled in the art to which the invention relates upon reading the following description with reference to the accompanying drawings, in which.

DETAILED DESCRIPTION OF THE INVENTION

Figure 1:
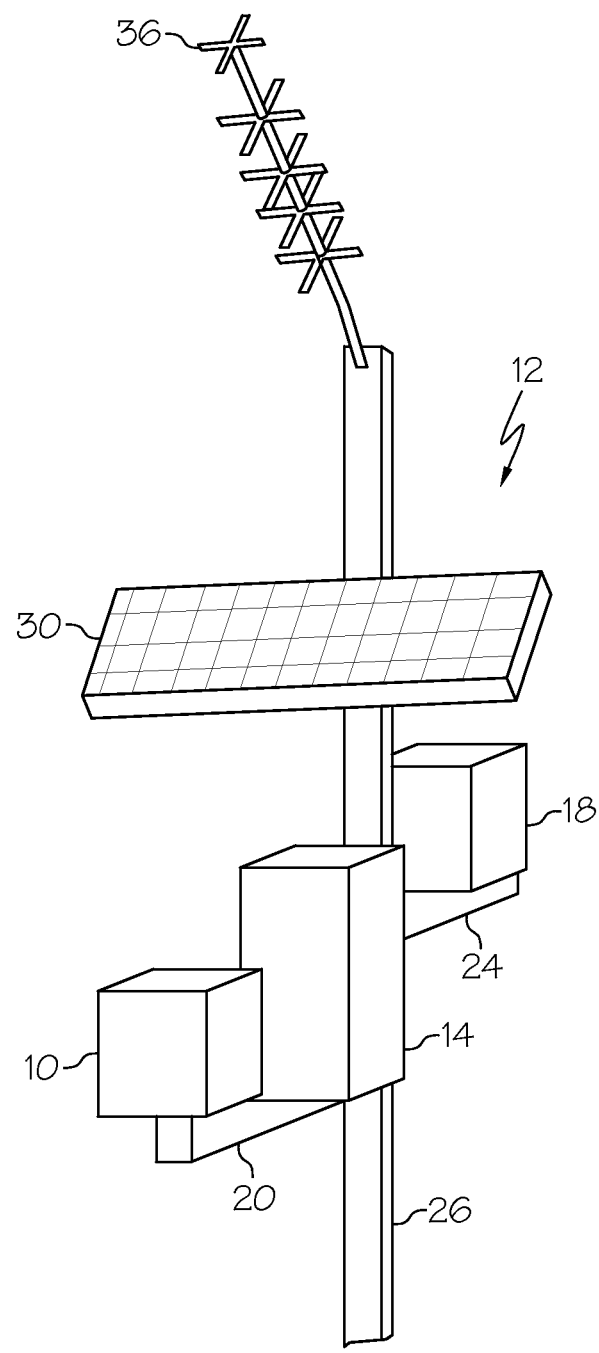
FIG. 1 is a schematic isometric view of an example environmental radiation monitor in an example arrangement with associated equipment to be used in a field application.

Example embodiments that incorporate one or more aspects of the invention are described and illustrated in the drawings. These illustrated examples are not intended to be a limitation on the invention. For example, one or more aspects of the invention can be utilized in other embodiments and even other types of devices. Moreover, certain terminology is used herein for convenience only and is not to be taken as a limitation on the invention. Still further, in the drawings, the same reference numerals are employed for designating the same elements.

An example embodiment of an environmental radiation monitor 10 is schematically shown within FIG. 1. The environmental radiation monitor 10 is shown in one example arrangement 12 with associated equipment in a field application. It is to be appreciated that FIG. 1 merely shows one example of possible structures/configurations/etc. and that other examples are contemplated within the scope of the present invention. Generally, such an arrangement 12 is placed at an exterior location so that the environmental radiation monitor 10 can perform the function of monitoring low-level gamma radiation in the local area atmosphere. It is to be appreciated that the gamma radiation may be from known or, at times, unknown sources.

The arrangement 12 can include associated equipment, such as a controls package located within a protective enclosure 14. Such other, associated equipment operates in conjunction with the environmental radiation monitor 10. An external power supply, such as a battery located within a protective enclosure 18, can also be provided within the arrangement 12. The power supply can be used to provide power within the arrangement 12, including possible use by the environmental radiation monitor 10. The environmental radiation monitor 10, the controls package located within a protective enclosure 14, and the external power supply located within a protective enclosure 18 can be located upon any structural configuration. Within the shown example, these portions of the arrangement 12 are located on first and second arms 20 and 24 extending from a central post 26. The central post 26 serves as a firm support for the operating equipment while anchoring the arrangement 12 at a desired location.

Additional associated equipment of the arrangement 12 may include a solar panel array 30. The solar panel array 30 can be configured to supply an electrical charge to the external power supply, such as a battery. Communication equipment, including an antenna 36, can also be provided within arrangement 12 to permit communication between the controls package and a remotely located device/network/etc. (not shown). For example, the antenna 36 can transmit a signal conveying acquired data from the environmental radiation monitor 10 and receive software updates from the remotely located device/network/etc.

It is to be appreciated that the arrangement 12 shown in FIG. 1 is not limiting and other arrangements are also contemplated. For example, the environmental radiation monitor 10 and associated equipment can be housed within an enclosed structure that is typical of structures housing meteorological measuring equipment. At least one wall or door of the enclosed structure can include louvers to permit a free exchange of air between the interior and the exterior of the enclosed structure. In another example, the environmental radiation monitor 10 and associated equipment can be located on a mobile device. The environmental radiation monitors 10 can be used in a number of different arrangements 12 and the environmental radiation monitors 10 can be used individually or in plurality to measure various aspects of environmental radiation levels such as flow path, concentration, etc.

Figure 2:
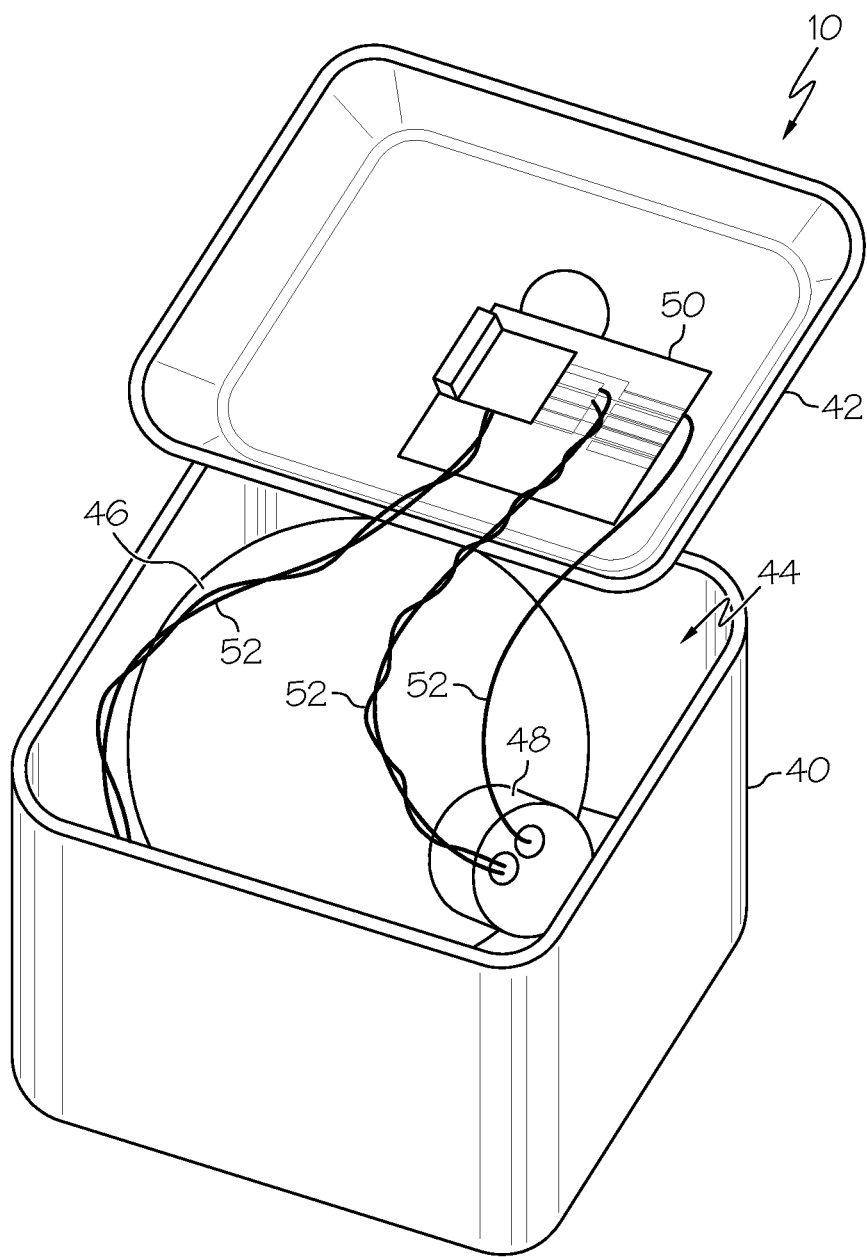
FIG. 2 is a schematic isometric view of the environmental radiation monitor of FIG. 1 with a lid opened.

Turning to FIG. 2, an example schematic representation of the environmental radiation monitor 10 is shown. The environmental radiation monitor 10 can include a protective enclosure 40 including a lid 42. While not shown, the lid 42 can be attached to the enclosure 40 in any number of ways including, but not limited to, hinges, latches, press fit, etc. The enclosure 40 includes an interior volume 44 that provides space for individual components of the environmental radiation monitor 10. One or more of the mating surfaces of the enclosure 40 and the lid 42 can be provided with seals. It is to be appreciated that the interior volume 44 of the enclosure 40 can be sealed so that little or no ambient atmosphere can enter the protective enclosure 40 during field deployment of the environmental radiation monitor 10. In addition to protection from atmospheric conditions such as humidity, the enclosure 40 and the lid 42 can also help protect the environmental radiation monitor 10 from physical damage. Protection from physical damage during handling or deployment can be provided by an amount of cushion material (not shown for clarity purposes) within the interior volume 44. The cushion material can include expanded polystyrene, foam rubber, or any number of other materials that tend to reduce the effects of impact, rapid deceleration, etc.

The schematic representation of the environmental radiation monitor 10 shown in FIG. 2 includes one possible arrangement of some individual components of the environmental radiation monitor 10. A high pressure ionization chamber 46 is located within the interior volume 44. The high pressure ionization chamber 46 is configured to create an output of a current signal proportional to the amount of gamma radiation passing into the high pressure ionization chamber 46. The exterior wall of the high pressure ionization chamber 46 can include an attached electrometer enclosure 48 configured to contain electronic circuitry that will be described below. The electrometer enclosure 48 can be constructed of metal or other materials that can transmit heat relatively easily. The electrometer enclosure 48 can also be sealed so that little or no ambient atmosphere can enter the electrometer enclosure 48 during field deployment of the environmental radiation monitor 10. One or both of the high pressure ionization chamber 46 and the electronic circuitry within the electrometer enclosure 48 can be electrically connected to a controller 50 through lines 52.

Figure 3:
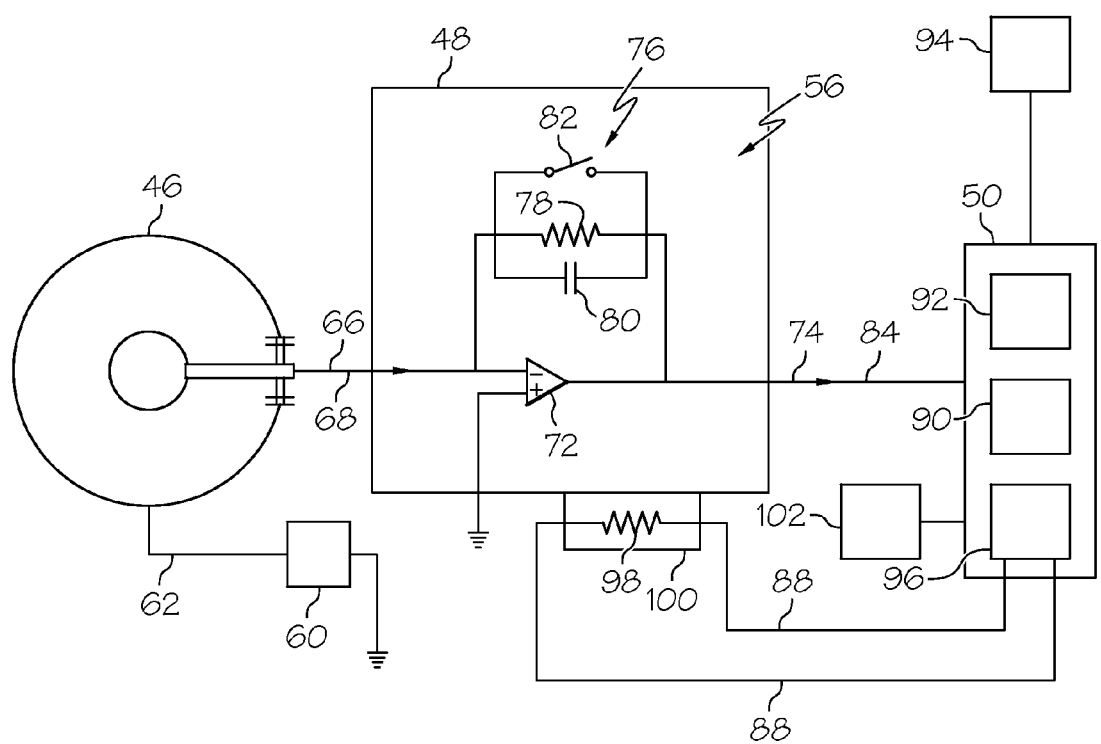
FIG. 3 is a schematic electrical diagram of an example self-heating electrometer shown with a high pressure ionization chamber and a controller as used in the environmental radiation monitor of FIG. 1.

Turning to FIG. 3, an electrical schematic of an example electrometer 56 that can be used in an example environmental radiation monitor 10 is shown. The environmental radiation monitor 10 includes a power supply 60. The power supply may be the power supply within the enclosure 18 and/or a separate power component that is provided with power therefrom. The high pressure ionization chamber 46 is electrically connected to the power supply 60 through line 62. In one example, the power supply 60 provides a 400 volt signal to the high pressure ionization chamber 46, although other suitable power supply signals are contemplated. The power supply 60 can be located exterior to the enclosure 40 (best seen in FIG. 2) or within the interior volume 44 of the enclosure 40.

The high pressure ionization chamber 46 creates a current signal 66 in proportional to the amount of gamma radiation passing into the high pressure ionization chamber 46. The current signal 66 can be of relatively small magnitude. In one example, the current signal 66 is about $1\times10^{-11}$ amperes (amps). In another example, the current signal 66 is about $1\times10^{-13}$ amps. The current signal 66 passes along line 68 from the high pressure ionization chamber 46 to the electrometer 56.

The electrometer 56 can be contained within the electrometer enclosure 48. The electrometer 56 includes an operational amplifier (op amp) 72, which is one example of an electrical amplifier. The op amp 72 receives the current signal 66, and converts the current signal 66 to a voltage signal 74 that is readable by the controller 50. The electrometer 56 includes a compensation circuit 76 electrically connected to the op amp 72. In one example, the compensation circuit 76 can include a resistor 78, a capacitor 80, and a switch 82 electrically connected in parallel.

One factor that can complicate the process of converting the current signal 66 input to a readable voltage signal 74 output is temperature drift. The resultant voltage signal 74 is governed by the relationship of $V=I \times R$ where V represents the voltage signal 74, I represents the current signal 66, and R represents the resistance of the electrometer 56. The resistance value R varies as a function of variation of operating temperature. Therefore, even with a constant current signal 66 representing a constant exposure to gamma radiation, the voltage signal 74 can vary due to the fluctuating resistance value R of the electrometer 56 at varying temperatures. Variation in values of the voltage signal 74 with a constant value of the current signal 66 can cause erroneous reporting or recording of gamma radiation readings.

In order to correct erroneous gamma radiation readings due to temperature drift effects in the electrometer 56, the electrometer 56 can adjust the voltages signal 74 to compensate the temperature drift effects. One method of compensating the temperature drift effects is to verify the temperature drift in a controlled setting and then implement correction factors into the electronic components of the electrometer 56 to compensate for temperature differences. In one example, prior to installation into a desired application, an electrometer can be placed into a temperature-controlled vessel. While applying a constant current signal 66 input to the electrometer 56, the interior temperature of the vessel is changed, and the resulting voltage signal 74 output is recorded. The results of the temperature variation can be used to create correction factors which are then implemented into the electronic components of the electrometer 56. After the correction factors are implemented into the electronic components of the electrometer 56, a constant current signal 66 input will result in a constant or nearly constant voltage signal 74 output over a relatively wide temperature range. As each electrometer 56 has its own temperature drift profile, the described method is typically completed for every electrometer 56 on an individual basis.

In one example, the correction factor can take the form $A \times \text{Temperature}+B$, where A and B are constants. In other examples, A and B can also represent linear or non-linear functions. Additionally, the correction factor can function to compensate for at least two different types of drift. First, the correction factor can compensate for the gain of the op amp 72 as determined by $I^*R=V$ where the resistance value of the resistor varies with temperature. Second, the correction factor can compensate for the zero point drift (or offset) of the op amp 72.

While the compensation circuit 76 in FIG. 3 shows one sub-circuit including a resistor 78, a capacitor 80, and a switch 82 electrically connected in parallel, it is to be appreciated that other arrangements are also contemplated. For example, a plurality of sub-circuits each including a resistor, a capacitor, and a switch can be electrically connected so that each sub-circuit is connected parallel to every other sub-circuit. Each sub-circuit can have a different correction factor associated with the sub-circuit. Due to limitations with particular correction factors, a particular sub-circuit or a combination of sub-circuits can be switched into use for a particular range of current signal 66 values. The use of a particular sub-circuit or sub-circuits including individual correction factors enables the electrometer 56 to produce a voltage signal 74 that more accurately reflects the current signal 66 over a wide range of current signal 66 values. As an example, the gamma radiation penetrating the high pressure ionization chamber 46 can be about one micro Roentgen per hour to about 100 Roentgen per hour resulting in a $1 \times 10^8$ dynamic range. One sub-circuit within the compensation circuit 76 can be switched into the compensation circuit 76 for a first portion of the dynamic range, a second sub-circuit can be switched into the compensation circuit 76 for a second portion of the dynamic range, etc. Each of the sub-circuits can have a correction factor individually tailored for a particular portion of the dynamic range.

When used in conjunction with an environmental radiation monitor 10, the electrometer 56 can be electrically connected to a controller 50 by line 84. The controller 50 receives the voltage signal 74 and can process the voltage signal 74 in any number of ways. In one example, an analog to digital converter within the controller 50 can convert the analog voltage signal 74 to a digital signal. A microprocessor 90 can then receive the digital voltage signal and carry-out any necessary corrections to the digital voltage signal. The corrected digital voltage signal can then be placed in electronic memory 92 for retrieval at a later time through a suitable output 94. One example output can be a standard weather-tight port located on the protective enclosure 40 (best seen in FIG. 2). Alternatively, the corrected digital voltage signal can be transmitted to another location via other example outputs 94, such as a two-way communication system for example, an antenna, a satellite dish, etc.

In order to help end users determine whether the correction factors remain accurate, the controller 50 can include a test function 96. The test function can activate a heat producing device 98 to increase the temperature around the electrometer 56. The heat producing device 98 can have a variety of constructions, configurations, and manner of operations. Also, the heat producing device 98 can have single or multiple elements/aspects. The heat can be provided in any manner, such as ambient, radiant, direct, in-direct, convection, etc. In one example, the heat producing device 98 can be a mechanism to deliver (e.g., blow) warmed air onto the electrometer 56 or onto the electrometer enclosure 48. However, within the shown example, the heat producing device 98 is a resistor 98. Current is passed through the resistor 98 to cause the resistor to output heat.

The test function 96 can send an electrical signal through lines 88 in order to pass a current through the resistor 98 (e.g., the heat producing device). The resistor 98 will, in turn, create heat that can increase the temperature around the electrometer 56, thereby inducing a temperature change of the op amp 72 and the compensation circuit 76. The electrometer 56 paired with the heat producing device, such as resistor 98, can be termed a self-heating electrometer.

The resistor 98 can be located within the interior or on the exterior of the electrometer enclosure 48. However, it is to be appreciated that placement of the resistor 98 may require a balance of the benefits of close proximity to the op amp 72 and the compensation circuit 76 versus the benefits of increasing the temperature of the op amp 72 and the compensation circuit 76 evenly. While some positions of the resistor 98 can foster relatively quick heating of the op amp 72 and/or the compensation circuit 76 due to proximity, other positions foster more even heating of the op amp 72 and the compensation circuit 76, which can be beneficial. In one example, the resistor 98 is located within the electrometer enclosure 48 and dissipates its thermal energy into the air inside the sealed electrometer enclosure 48. In another example, the resistor is attached to the exterior surface of the electrometer enclosure 48. In another example, the resistor 98 is placed within an enclosure 100 that is attached to the exterior surface of the electrometer enclosure 48. As current passes through the resistor 98, the resistor 98 begins to heat. An amount of the heat produced by the resistor 98 will transfer to the metal electrometer enclosure 48 to heat the electrometer enclosure 48 directly. The heated electrometer enclosure 48 will then transfer heat to its interior and raise the temperature of the op amp 72 and the compensation circuit 76.

The controller 50 can include a thermocouple 102 located in relationship to the electrometer 56 so as to provide an accurate measure of the temperature of the op amp 72 and the compensation circuit 76. The test function 96 can include a program to maintain the current signal to the resistor 98 until the op amp 72 and the compensation circuit 76 reach a predetermined temperature as read by the thermocouple 102. In one example, the test function can have a program of steps to heat the op amp 72 and the compensation circuit 76 to a plurality of predetermined temperatures in a sequence.

When each of the predetermined temperatures is reached, the controller 50 can receive the voltage signal 74 from the electrometer 56, and compare the measured value of the voltage signal 74 at that time to a measured, initial value of the voltage signal 74 at a time prior to the test function 96 heating application. If the measured value of the voltage signal 74 at each of the predetermined temperatures is equal or very nearly equal to the initial value, such indicates that the correction factor in the compensation circuit 76 remains accurate. When there are multiple sub-circuits within the compensation circuit 76, the above described steps can be carried out for each individual sub-circuit to verify the correction factor for each sub-circuit remains accurate.

In the event that results of the test function 96 indicate the correction factor for the electrometer 56 is no longer accurate, the correction factor may have to be changed. In one example, software changes can be transmitted to the controller 50 from an outside location to improve the correction factor. In another example, a service technician can be dispatched to be physically present at the environmental radiation monitor 10 to modify the correction factor manually. In yet another example, the environmental radiation monitor 10 can be removed and shipped to a service facility for modification of the correction factor.

Figure 4:
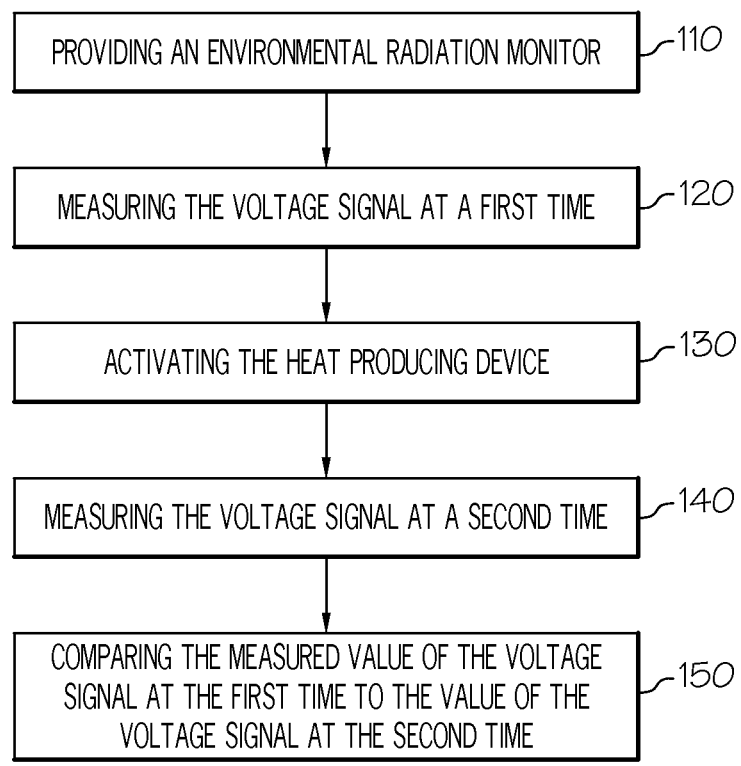
FIG. 4 is a top level flow diagram of an example method of conducting a temperature compensation test cycle for an environmental radiation monitor.

An example method of conducting a temperature compensation test cycle for an environmental radiation monitor 10 is generally described in FIG. 4. The method can be performed in connection with the example environmental radiation monitor 10 shown in FIG. 2 and the example self-heating electrometer 56 shown in FIG. 3. The method includes the step 110 of providing an environmental radiation monitor 10. As described above, the environmental radiation monitor 10 can include a power supply 60 and a high pressure ionization chamber 46 electrically connected to the power supply 60. The high pressure ionization chamber 46 is configured to produce a current signal 66 which is received by an electrometer 56. The electrometer 56 includes an op amp 72 which is one example of an electrical amplifier. The op amp 72 converts the current signal 66 to a voltage signal 74. A compensation circuit 76 is electrically connected to the op amp 72, wherein the compensation circuit 76 is configured to modify the voltage signal 74. The electrometer 56 also includes a resistor 98, which is one example of a heat producing device. The resistor 98 is configured to induce a temperature change of the op amp 72 and the compensation circuit 76.

The method further includes the step 120 of measuring the voltage signal 74 at a first time. The microprocessor 90 can read the measured value of the voltage signal 74 after an analog to digital conversion and store the measured value in electronic memory 92 connected to the microprocessor 90. The method still further includes the step 130 of activating the heat producing device, such as resistor 98. The resistor 98 induces a temperature change of the electrical amplifier, such as op amp 72, and the compensation circuit 76.

The method also includes the step 140 of measuring the voltage signal 74 at a second time. This second time is at a time when the op amp 72 and the compensation circuit 76 have reached a predetermined temperature as programmed into the test function 96. The method further includes the step 150 of comparing the measured value of the voltage signal at the first time to the value of the voltage signal at the second time, wherein the comparison indicates the accuracy of an electrometer 56 temperature compensation.

The method can also be used with an environmental radiation monitor 10 that includes an electrometer enclosure 48 configured to contain the electrometer 56. Furthermore, the resistor 98 can be attached to the electrometer enclosure 48.

In another example of the method, the step of activating the resistor 98 includes inducing a temperature change of the electrometer 56, the op amp 72 and the compensation circuit 76 of at least 20° C. In another example, the resistor 98 induces a temperature change of the electrometer 56, the op amp 72 and the compensation circuit 76 of at least 30° C. When a desired predetermined temperature is reached, the controller 50 can receive the voltage signal 74 from the electrometer 56, and compare the measured value of the voltage signal 74 at that time to the measured value of the voltage signal 74 at a time prior to the test function 96 heating application. If the measured values of the voltage signal 74 at the described times are equal or very nearly equal, that is one indication that the correction factor in the compensation circuit 76 remains accurate.

In the described examples, the method and apparatus provide a relatively inexpensive means of helping to ensure that data obtained from the environmental radiation monitor 10 remains properly compensated for temperature drift while deployed in the field. The method and apparatus can help the end user of the environmental radiation monitor 10 remotely troubleshoot problems and help the end user diagnose problems with temperature compensation.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

What is claimed is:

1. An environmental radiation monitor including:
   a power supply;
   a high pressure ionization chamber electrically connected to the power supply, wherein the high pressure ionization chamber is configured to produce a current signal;
   an electrometer electrically connected with the high pressure ionization chamber, wherein the electrometer includes:
   an electrical amplifier receiving the current signal, wherein the electrical amplifier is configured to convert the current signal to a voltage signal,
   a compensation circuit electrically connected to the electrical amplifier, wherein the compensation circuit is configured to modify the voltage signal, and a heat producing device, wherein the heat producing device is activatable to induce a temperature increase to the electrical amplifier and the compensation circuit; and a controller operatively connected to the electrometer, including operatively connected to the heat producing device, and including a test function portion for activating the heat producing device to increase the temperature around the electrometer and comparing a value of the voltage signal prior to the temperature increase to a value of the voltage signal subsequent to the temperature increase to determine temperature dependent voltage signal variance.

2. The environmental radiation monitor according to claim 1, wherein the heat producing device is a resistor.

3. The environmental radiation monitor according to claim 1, further including an electrometer enclosure configured to enclose at least some portions of the electrometer.

4. The environmental radiation monitor according to claim 3, wherein the heat producing device is attached to the electrometer enclosure.

5. The environmental radiation monitor according to claim 1, wherein the compensation circuit is configured to modify the voltage signal by a correction factor to compensate for temperature variation of the electrical amplifier and the compensation circuit.

6. The environmental radiation monitor according to claim 1, further including a controller, wherein the controller receives the voltage signal.

7. A method of conducting a temperature compensation test cycle for an environmental radiation monitor including:

providing an environmental radiation monitor including a power supply, a high pressure ionization chamber electrically connected to the power supply, wherein the high pressure ionization chamber is configured to produce a current signal, an electrometer electrically connected with the high pressure ionization chamber, wherein the electrometer includes an electrical amplifier receiving the current signal, wherein the electrical amplifier is configured to convert the current signal to a voltage signal, a compensation circuit electrically connected to the electrical amplifier, wherein the compensation circuit is configured to modify the voltage signal, and a heat producing device, wherein the heat producing device is activatable to induce a temperature increase to the electrical amplifier and the compensation circuit, and a controller operatively connected to the electrometer, including operatively connected to the heat producing device, and including a test function portion for activating the heat producing device to increase the temperature around the electrometer and comparing a value of the voltage signal prior to the temperature increase to a value of the voltage signal subsequent to the temperature increase to determine temperature dependent voltage signal variance;

measuring the voltage signal at a first time;

activating the heat producing device, wherein the heat producing device induces a temperature increase to the electrical amplifier and the compensation circuit;

measuring the voltage signal at a second time; and comparing the measured value of the voltage signal at the first time to the value of the voltage signal at the second time, wherein the comparison indicates the accuracy of an electrometer temperature compensation.

8. The method according to claim 7, wherein the heat producing device is a resistor.

9. The method according to claim 7, wherein the environmental radiation monitor further includes an electrometer enclosure configured to enclose at least some portions of the electrometer.

10. The method according to claim 9, wherein the resistor is attached to the electrometer enclosure.

11. The method according to claim 7, wherein the step of activating the heat producing device includes inducing a temperature change of the electrometer of at least 20° C.

12. The method according to claim 7, wherein the step of activating the heat producing device includes inducing a temperature change of the electrometer of at least 30° C.

13. The method according to claim 7, wherein the step of providing the environmental radiation monitor further includes compensating the voltage signal with the compensation circuit to correct for variations due to temperature variation of the electrical amplifier and the compensation circuit.

14. The method according to claim 7, wherein the environmental radiation monitor further includes a controller.

* * * * *